US011579438B2

(12) United States Patent
Suzuki et al.

(10) Patent No.: US 11,579,438 B2
(45) Date of Patent: Feb. 14, 2023

(54) OPTICAL MODULE

(71) Applicant: HAMAMATSU PHOTONICS K.K., Hamamatsu (JP)

(72) Inventors: Tomofumi Suzuki, Hamamatsu (JP); Tatsuya Sugimoto, Hamamatsu (JP); Kyosuke Kotani, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 531 days.

(21) Appl. No.: 16/492,684

(22) PCT Filed: Mar. 14, 2018

(86) PCT No.: PCT/JP2018/009995
§ 371 (c)(1),
(2) Date: Sep. 10, 2019

(87) PCT Pub. No.: WO2018/168936
PCT Pub. Date: Sep. 20, 2018

(65) Prior Publication Data
US 2020/0049977 A1 Feb. 13, 2020

(30) Foreign Application Priority Data

Mar. 14, 2017 (JP) .............................. JP2017-048569

(51) Int. Cl.
*G02B 26/00* (2006.01)
*G02B 26/08* (2006.01)
(Continued)

(52) U.S. Cl.
CPC ............ *G02B 26/0841* (2013.01); *B81B 3/00* (2013.01); *G01J 3/4535* (2013.01); *G01N 21/35* (2013.01);
(Continued)

(58) Field of Classification Search
CPC ...... G02B 26/0841; G02B 5/08; G02B 5/124; G02B 26/001; G02B 26/06; G02B 26/00;
(Continued)

(56) References Cited

U.S. PATENT DOCUMENTS

2006/0066964 A1 3/2006 Greywall
2010/0208347 A1* 8/2010 Kouma ................. H02N 1/006
359/578
(Continued)

FOREIGN PATENT DOCUMENTS

CN 1504765 A 6/2004
CN 1776476 A 5/2006
(Continued)

OTHER PUBLICATIONS

International Preliminary Report on Patentability dated Sep. 26, 2019 for PCT/JP2018/009995.

*Primary Examiner* — Mustak Choudhury
(74) *Attorney, Agent, or Firm* — Faegre Drinker Biddle & Reath LLP

(57) ABSTRACT

An optical module includes a support layer, a device layer which is provided on the support layer, and a movable mirror which is mounted in the device layer. The device layer has a mounting region in which the movable mirror is mounted, and a driving region which is connected to the mounting region. A space corresponding to at least the mounting region and the driving region is formed between the support layer and the device layer. The mounting region is disposed between a pair of elastic support regions included in the driving region and is supported by the pair of elastic support regions.

6 Claims, 13 Drawing Sheets

(51) Int. Cl.
*B81B 3/00* (2006.01)
*G01J 3/453* (2006.01)
*G01N 21/35* (2014.01)
*G02B 5/08* (2006.01)
*G02B 5/124* (2006.01)
*G02B 26/06* (2006.01)

(52) U.S. Cl.
CPC ........... *G02B 5/08* (2013.01); *G02B 5/124* (2013.01); *G02B 26/001* (2013.01); *G02B 26/06* (2013.01); *B81B 2201/042* (2013.01)

(58) Field of Classification Search
CPC ......... G01J 3/4535; G01J 3/021; G01J 3/027; G01J 3/45; G01N 21/35; B81B 3/00; B81B 2201/042
See application file for complete search history.

(56) References Cited

U.S. PATENT DOCUMENTS

| | | | |
|---|---|---|---|
| 2014/0192365 A1 | 7/2014 | Mortada et al. | |
| 2016/0187581 A1 | 6/2016 | Pinguet et al. | |
| 2016/0274302 A1 | 9/2016 | Kuo et al. | |

FOREIGN PATENT DOCUMENTS

| | | | | |
|---|---|---|---|---|
| CN | 1918497 A | 2/2007 | | |
| CN | 1303448 C | 3/2007 | | |
| CN | 101281295 A | 10/2008 | | |
| CN | 101619954 A | 1/2010 | | |
| CN | 101641580 A | 2/2010 | | |
| CN | 101786592 A | 7/2010 | | |
| CN | 102067009 A | 5/2011 | | |
| CN | 102355306 A | 2/2012 | | |
| CN | 102834764 A | 12/2012 | | |
| CN | 202995136 U | 6/2013 | | |
| CN | 103547528 A | 1/2014 | | |
| CN | 103576242 A | 2/2014 | | |
| CN | 103840704 A | 6/2014 | | |
| CN | 104570334 A | 4/2015 | | |
| CN | 105051484 A | 11/2015 | | |
| CN | 105137597 A | 12/2015 | | |
| CN | 105492879 A | 4/2016 | | |
| CN | 105594114 A | 5/2016 | | |
| CN | 105676446 A | 6/2016 | | |
| CN | 106164741 A | 11/2016 | | |
| CN | 106463374 A | 2/2017 | | |
| JP | 2004-82288 A | 3/2004 | | |
| JP | 2006-102934 A | 4/2006 | | |
| JP | 2010-170029 A | 8/2010 | | |
| JP | 2010-184334 A | 8/2010 | | |
| JP | 2012-524295 A | 10/2012 | | |
| JP | 2012-240129 A | 12/2012 | | |
| WO | WO-2010/121185 A1 | 10/2010 | | |
| WO | WO-2011037015 A1 * | 3/2011 | ............ | G01J 3/4532 |

* cited by examiner (a)

(b)

OPTICAL MODULE

TECHNICAL FIELD

The present disclosure relates to an optical module.

BACKGROUND ART

Optical modules in which an interference optical system is formed on a silicon-on-insulator (SOI) substrate by a micro electro mechanical systems (MEMS) technology are known (for example, refer to Patent Literature 1). Such optical modules have attracted attention because they can provide users with a Fourier transform infrared spectroscopic analyzer (FTIR) in which highly accurate optical disposition is realized.

CITATION LIST

Patent Literature

Patent Literature 1: Japanese Unexamined Patent Publication No. 2012-524295

SUMMARY OF INVENTION

Technical Problem

However, the foregoing optical modules have the following problem in respect that the size of a movable mirror depends on a degree of completion of deep cutting with respect to an SOI substrate, for example. That is, since the degree of completion of deep cutting with respect to an SOI substrate is approximately 500 µm at the maximum, there is a limitation in increasing the size of a movable mirror for the sake of improvement of sensitivity of an FTIR. Here, a technology of mounting a separately formed movable mirror in a device layer (for example, a layer of an SOI substrate in which a driving region is formed) may be taken into consideration.

An object of the present disclosure is to provide an optical module in which reliable movement of a movable mirror mounted in a device layer is realized.

Solution to Problem

According to an aspect of the present disclosure, there is provided an optical module including a support layer, a device layer which is provided on the support layer, and a movable mirror which is mounted in the device layer. The device layer has a mounting region in which the movable mirror is mounted, and a driving region which is connected to the mounting region. A space corresponding to at least the mounting region and the driving region is formed between the support layer and the device layer. The mounting region is disposed between a pair of elastic support regions included in the driving region and is supported by the pair of elastic support regions.

In this optical module, in the device layer, the mounting region in which the movable mirror is mounted is disposed between the pair of elastic support regions and is supported by the pair of elastic support regions. Accordingly, for example, compared to a case where a region extending from the mounting region is supported by an elastic support region, the mounting region in which the movable mirror is mounted can be stably moved. Thus, according to this optical module, reliable movement of the movable mirror mounted in the device layer is realized.

According to the aspect of the present disclosure, the optical module may further include an intermediate layer which is provided between the support layer and the device layer. An opening may be formed in the intermediate layer. The space may include a region inside the opening. The support layer may be a first silicon layer of an SOI substrate. The device layer may be a second silicon layer of the SOI substrate. The intermediate layer may be an insulating layer of the SOI substrate. Accordingly, it is possible to favorably realize a configuration for reliable movement of the movable mirror mounted in the device layer using the SOI substrate.

According to the aspect of the present disclosure, in the optical module, the pair of elastic support regions may sandwich the mounting region from both sides when viewed in a direction in which the mounting region moves. Accordingly, it is possible to simplify the configuration for reliable movement of the movable mirror mounted in the device layer.

According to the aspect of the present disclosure, in the optical module, a mirror surface of the movable mirror may intersect the mounting region. Accordingly, a centroid position of the movable mirror can be brought closer to the mounting region. Therefore, it is possible to more stably move the mounting region in which the movable mirror is mounted.

According to the aspect of the present disclosure, the optical module may further include a fixed mirror which is mounted in at least one of the support layer, the device layer, and an intermediate layer which is provided between the support layer and the device layer; and a beam splitter which is mounted in at least one of the support layer, the device layer, and the intermediate layer. The movable mirror, the fixed mirror, and the beam splitter may be disposed such that an interference optical system is constituted. Accordingly, it is possible to obtain an FTIR having improved sensitivity.

According to the aspect of the present disclosure, the optical module may further include a light incident unit which is disposed such that measurement light is incident on the interference optical system from outside, and a light emission unit which is disposed such that the measurement light is emitted from the interference optical system to the outside. Accordingly, it is possible to obtain an FTIR including a light incident unit and a light emission unit.

Advantageous Effects of Invention

According to the present disclosure, it is possible to provide an optical module in which reliable movement of the movable mirror mounted in the device layer is realized.

DESCRIPTION OF EMBODIMENTS

Hereinafter, embodiments of the present disclosure will be described in detail with reference to the drawings. The same reference signs are applied to parts which are the same or corresponding in each of the drawings, and duplicated parts will be omitted.

Configuration of Optical Module

Figure 1:
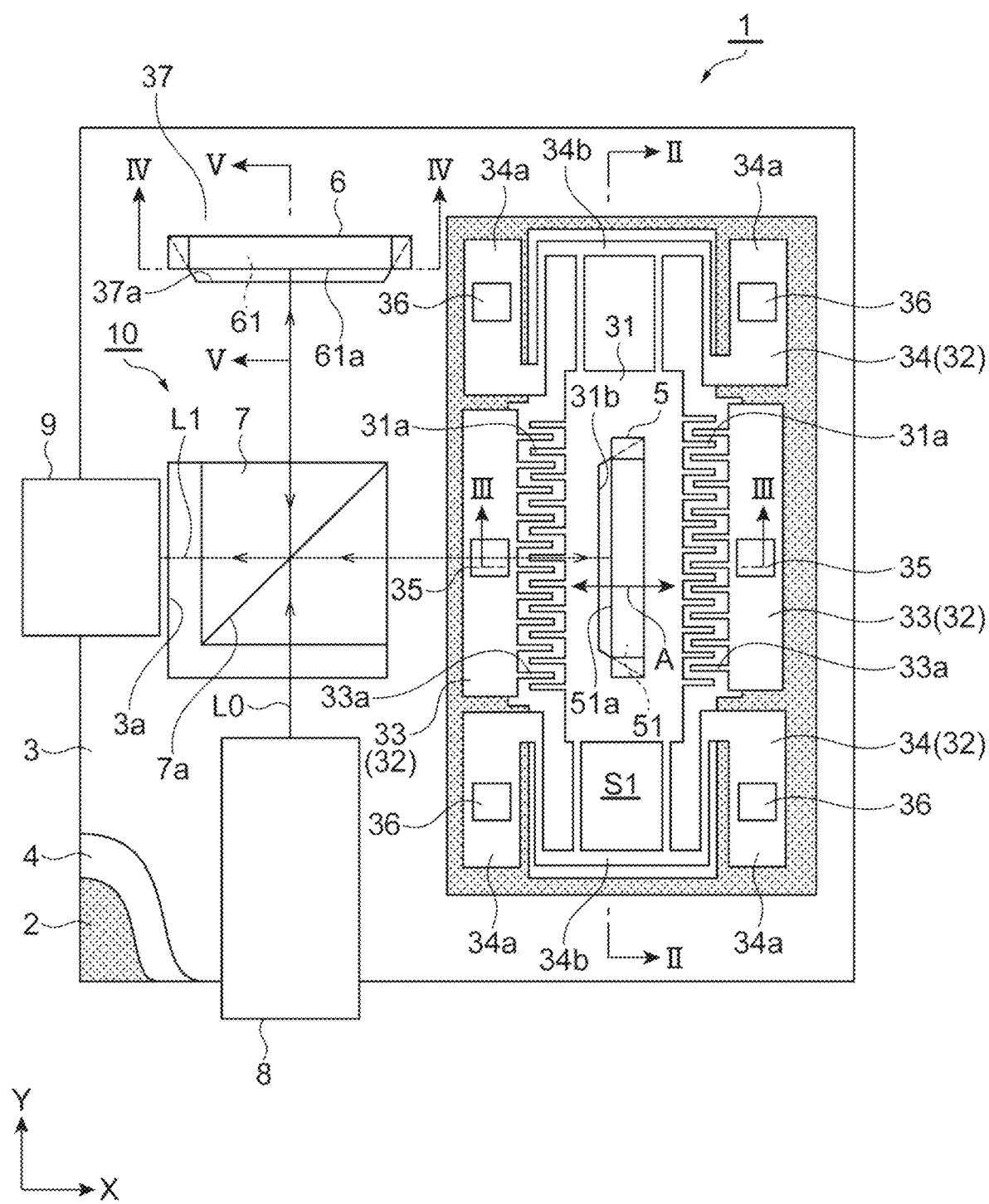
FIG. 1 is a plan view of an optical module of an embodiment.

As illustrated in FIG. 1, an optical module 1 includes a support layer 2, a device layer 3 which is provided on the support layer 2, and an intermediate layer 4 which is provided between the support layer 2 and the device layer 3. The support layer 2, the device layer 3, and the intermediate layer 4 are constituted of an SOI substrate. Specifically, the support layer 2 is a first silicon layer of the SOI substrate. The device layer 3 is a second silicon layer of the SOT substrate. The intermediate layer 4 is an insulating layer of the SOI substrate. The support layer 2, the device layer 3, and the intermediate layer 4 exhibit a rectangular shape of which one side is approximately 10 mm, for example, when viewed in a Z-axis direction (direction parallel to a Z-axis) that is a stacking direction thereof. The thickness of each of the support layer 2 and the device layer 3 is approximately several hundreds of μm, for example. The thickness of the intermediate layer 4 is approximately several μm, for example. FIG. 1 illustrates the device layer 3 and the intermediate layer 4 in a state where one corner portion of the device layer 3 and one corner portion of the intermediate layer 4 are cut out.

The device layer 3 has a mounting region 31 and a driving region 32 which is connected to the mounting region 31. The driving region 32 includes a pair of actuator regions 33 and a pair of elastic support regions 34. The mounting region 31 and the driving region 32 (that is, the mounting region 31, the pair of actuator regions 33, and the pair of elastic support regions 34) are integrally formed in a portion of the device layer 3 by a MEMS technology (patterning and etching).

The pair of actuator regions 33 are disposed on both sides of the mounting region 31 in an X-axis direction (direction parallel to an X-axis orthogonal to the Z-axis). That is, the mounting region 31 is disposed between the pair of actuator regions 33 in the X-axis direction. Each of the actuator regions 33 is fixed to the support layer 2 with the intermediate layer 4 interposed therebetween. A first comb-teeth portion 33a is provided on a side surface of each of the actuator regions 33 on the mounting region 31 side. Each of the first comb-teeth portions 33a is in a state of being detached with respect to the support layer 2 after the intermediate layer 4 immediately below thereof is removed. A first electrode 35 is provided in each of the actuator regions 33.

The pair of elastic support regions 34 are disposed on both sides of the mounting region 31 in a Y-axis direction (direction parallel to a Y-axis orthogonal to the Z-axis and the X-axis). That is, the mounting region 31 is disposed between the pair of elastic support regions 34 in the Y-axis direction. Both end portions 34a of each of the elastic support regions 34 are fixed to the support layer 2 with the intermediate layer 4 interposed therebetween. An elastic deformation portion 34b (part between both the end portions 34a) of each of the elastic support regions 34 has a structure in which a plurality of leaf springs are coupled. The elastic deformation portion 34b of each of the elastic support regions 34 is in a state of being detached with respect to the support layer 2 after the intermediate layer 4 immediately below thereof is removed. A second electrode 36 is provided in each of both the end portions 34a in each of the elastic support regions 34.

The elastic deformation portion 34b of each of the elastic support regions 34 is connected to the mounting region 31. The mounting region 31 is in a state of being detached with respect to the support layer 2 after the intermediate layer 4 immediately below thereof is removed. That is, the mounting region 31 is supported by the pair of elastic support regions 34. Second comb-teeth portions 31a are provided on side surfaces of the mounting region 31 on the actuator region 33 side. Each of the second comb-teeth portions 31a is in a state of being detached with respect to the support layer 2 after the intermediate layer 4 immediately below thereof is removed. In the first comb-teeth portions 33a and the second comb-teeth portions 31a facing each other, each comb tooth of the first comb-teeth portions 33a is positioned between comb teeth of the second comb-teeth portions 31a.

The pair of elastic support regions 34 sandwich the mounting region 31 from both sides when viewed in a direction A parallel to the X-axis. When the mounting region 31 moves in the direction A, the pair of elastic support regions 34 cause an elastic force to act on the mounting region 31 such that the mounting region 31 returns to the initial position. Therefore, when a voltage is applied to a part between the first electrode 35 and the second electrode 36 such that an electrostatic attraction acts between the first comb-teeth portions 33a and the second comb-teeth portions 31a facing each other, the mounting region 31 moves in the direction A to a position where the electrostatic attraction and the elastic force of the pair of elastic support regions 34 are balanced. In this manner, the driving region 32 functions as an electrostatic actuator.

The optical module 1 further includes a movable mirror 5, a fixed mirror 6, a beam splitter 7, a light incident unit 8, and a light emission unit 9. The movable mirror 5, the fixed mirror 6, and the beam splitter 7 are disposed on the device layer 3 such that an interference optical system 10 (Michelson interference optical system) is constituted.

The movable mirror 5 is mounted in the mounting region 31 of the device layer 3 on one side of the beam splitter 7 in the X-axis direction. A mirror surface 51a of a mirror portion 51 included in the movable mirror 5 is positioned on a side opposite to the support layer 2 with respect to the device layer 3. For example, the mirror surface 51a is a surface perpendicular to the X-axis direction (that is, a surface perpendicular to the direction A) and is directed to the beam splitter 7 side.

The fixed mirror 6 is mounted in a mounting region 37 of the device layer 3 on one side of the beam splitter 7 in the Y-axis direction. A mirror surface 61a of a mirror portion 61 included in the fixed mirror 6 is positioned on a side opposite to the support layer 2 with respect to the device layer 3. For example, the mirror surface 61a is a surface perpendicular to the Y-axis direction and is directed to the beam splitter 7 side.

The light incident unit 8 is mounted in the device layer 3 on the other side of the beam splitter 7 in the Y-axis direction. For example, the light incident unit 8 is constituted of optical fibers and a collimating lens. The light incident unit 8 is disposed such that measurement light is incident on the interference optical system 10 from outside.

The light emission unit 9 is mounted in the device layer 3 on the other side of the beam splitter 7 in the X-axis direction. For example, the light emission unit 9 is constituted of optical fibers and a collimating lens. The light emission unit 9 is disposed such that measurement light (interference light) is emitted from the interference optical system 10 to the outside.

The beam splitter 7 is a cube-type beam splitter having an optical functional surface 7a. The optical functional surface 7a is positioned on a side opposite to the support layer 2 with respect to the device layer 3. The beam splitter 7 is positionally aligned when one corner portion of the beam splitter 7 on a bottom surface side is brought into contact with one corner of a rectangular opening 3a formed in the device layer 3. The beam splitter 7 is mounted in the support layer 2 by being fixed to the support layer 2 through bonding or the like in a positionally aligned state.

In the optical module 1 having a configuration described above, when measurement light L0 is incident on the interference optical system 10 from outside via the light incident unit 8, a portion of the measurement light L0 is reflected by the optical functional surface 7a of the beam splitter 7 and travels toward the movable mirror 5, and the remaining portion of the measurement light L0 is transmitted through the optical functional surface 7a of the beam splitter 7 and travels toward the fixed mirror 6. A portion of the measurement light L0 is reflected by the mirror surface 51a of the movable mirror 5, travels toward the beam splitter 7 along the same optical path, and is transmitted through the optical functional surface 7a of the beam splitter 7. The remaining portion of the measurement light L0 is reflected by the mirror surface 61a of the fixed mirror 6, travels toward the beam splitter 7 along the same optical path, and is reflected by the optical functional surface 7a of the beam splitter 7. A portion of the measurement light L0 which has been transmitted through the optical functional surface 7a of the beam splitter 7, and the remaining portion of the measurement light L0 which has been reflected by the optical functional surface 7a of the beam splitter 7 become measurement light L1 (interference light). The measurement light L1 is emitted from the interference optical system 10 to the outside via the light emission unit 9. According to the optical module 1, since the movable mirror 5 can reciprocate in the direction A at a high speed, it is possible to provide a small-sized FTIR having high accuracy.

Movable Mirror and Surrounding Structure Thereof

Figure 2:
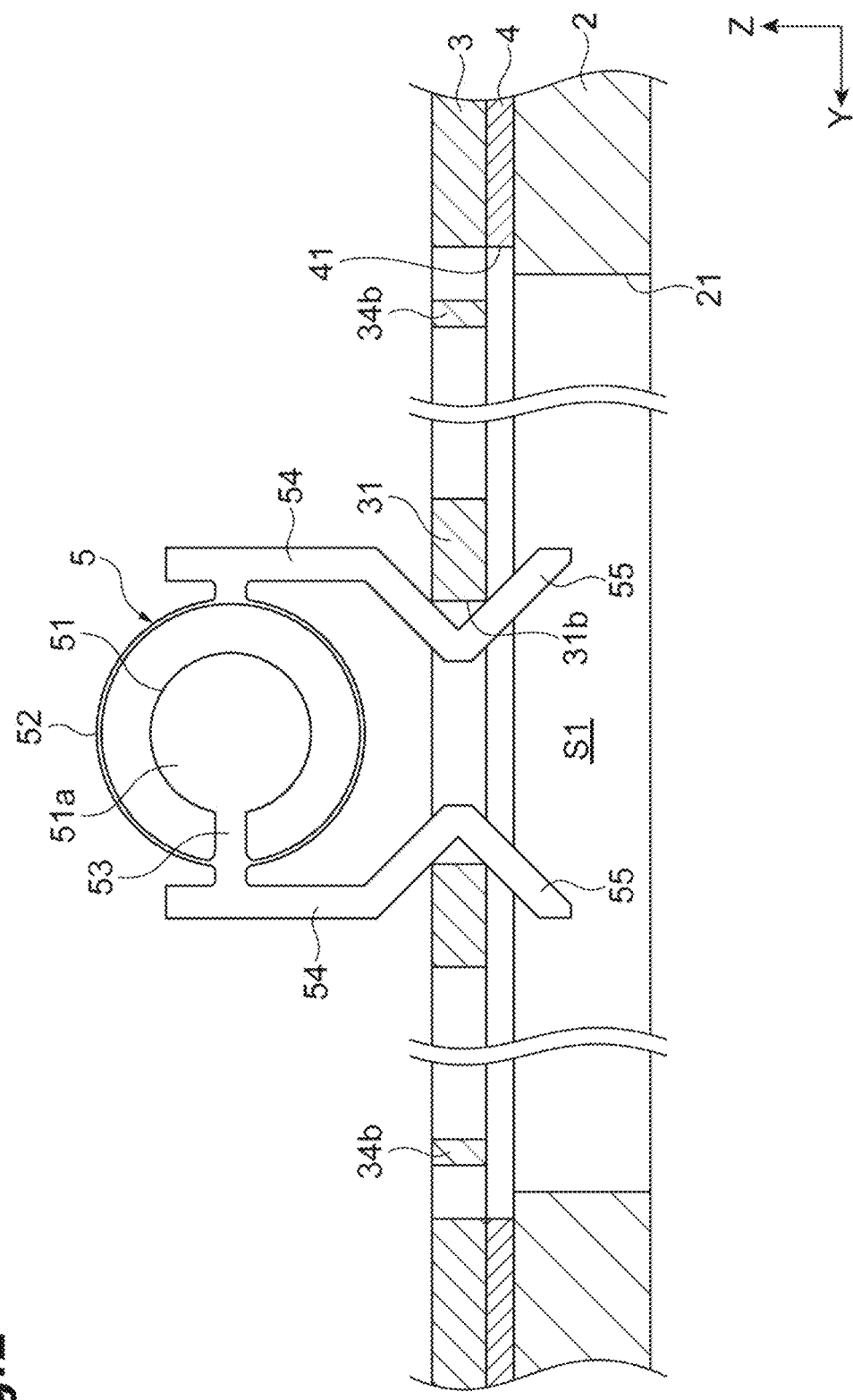
FIG. 2 is a cross-sectional view taken along line II-II illustrated in FIG. 1.
Figure 3:
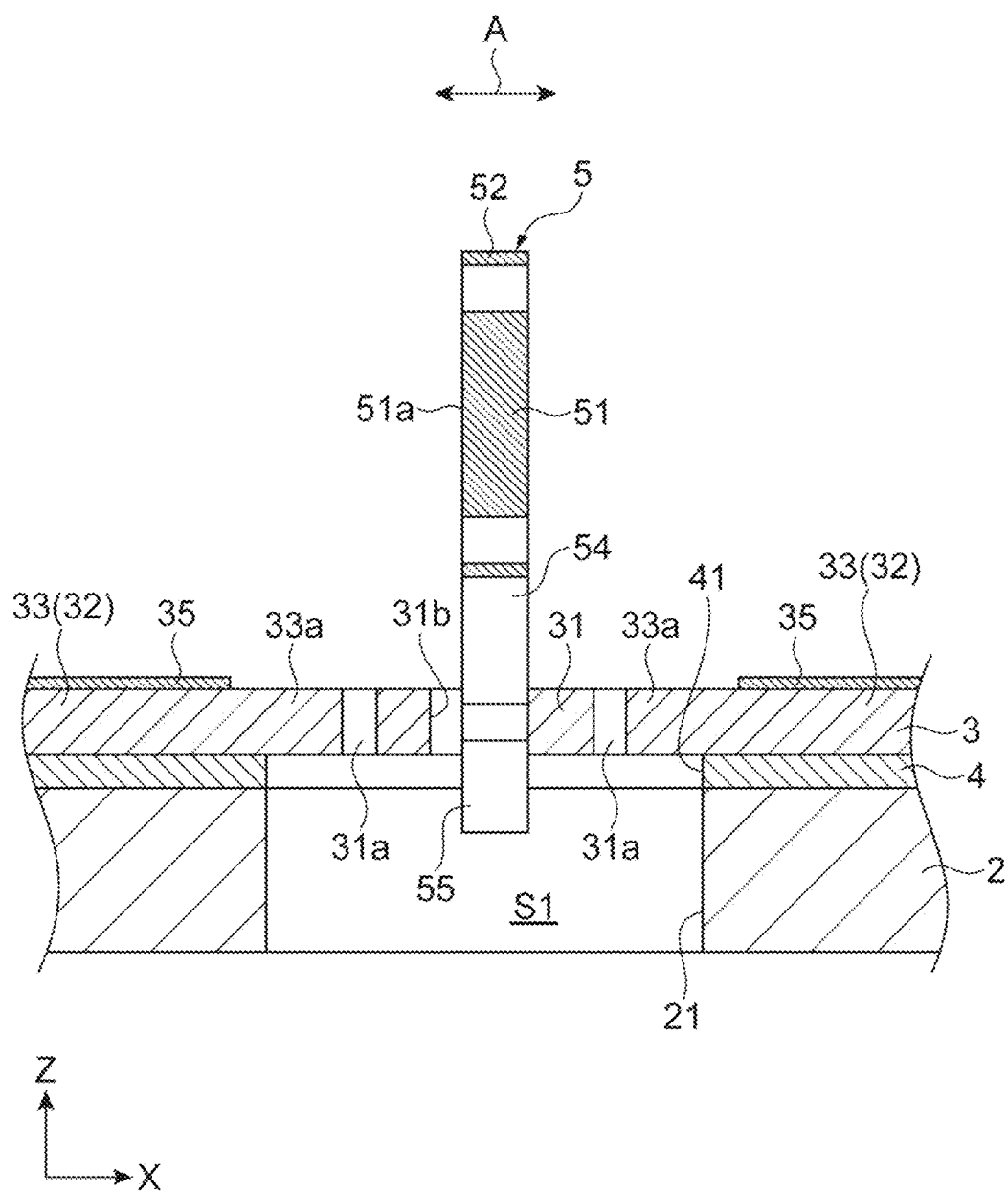
FIG. 3 is a cross-sectional view taken along line III-III illustrated in FIG. 1.

As illustrated in FIGS. 2 and 3, the movable mirror 5 has the mirror portion 51, an elastic portion 52, a coupling portion 53, a pair of leg portions 54, and a pair of interlock portions 55. The movable mirror 5 having a configuration described below is integrally formed by a MEMS technology (patterning and etching).

The mirror portion 51 is formed to have a plate shape (for example, a disk shape) having the mirror surface 51a as a main surface. The elastic portion 52 is formed to have an annular shape (for example, a circular shape) being separated from the mirror portion 51 and surrounding the mirror portion 51 when viewed in the X-axis direction (direction perpendicular to the mirror surface 51a). The coupling portion 53 causes the mirror portion 51 and the elastic portion 52 to be coupled to each other on one side in the Y-axis direction with respect to the center of the mirror portion 51 when viewed in the X-axis direction.

The pair of leg portions 54 are coupled to an outer surface of the elastic portion 52 on both sides in the Y-axis direction with respect to the center of the mirror portion 51 when viewed in the X-axis direction. That is, the mirror portion 51 and the elastic portion 52 are disposed between the pair of leg portions 54 in the Y-axis direction. Each of the leg portions 54 extends to the mounting region 31 side beyond the mirror portion 51 and the elastic portion 52. The pair of interlock portions 55 are respectively provided in end portions of the leg portions 54 on the mounting region 31 side. The interlock portions 55 are foliated to be bent inward (toward each other) in a V-shape, for example, when viewed in the X-axis direction.

The movable mirror 5 having a configuration described above is mounted in the mounting region 31 when the pair of interlock portions 55 are disposed in an opening 31b formed in the mounting region 31. The opening 31b is open on both sides of the mounting region 31 in the Z-axis direction. A portion of each of the interlock portions 55 protrudes from a surface of the mounting region 31 on the intermediate layer 4 side. That is, the movable mirror 5 penetrates the mounting region 31.

Forces act outward (away from each other) on the pair of interlock portions 55 disposed in the opening 31b of the mounting region 31. The movable mirror 5 is fixed to the mounting region 31 due to the forces. The forces are generated due to the annular elastic portion 52 which is compressed when the movable mirror 5 is mounted in the mounting region 31 and has a tendency of being restored to the initial state.

As illustrated in FIG. 1, the opening 31b is formed to have a trapezoidal shape widening toward the end on a side opposite to the beam splitter 7 when viewed in the Z-axis direction. When the pair of interlock portions 55 exhibiting inwardly bent shapes engage with the opening 31b exhibiting such a shape, the movable mirror 5 is positionally aligned (self-aligned) in each of the X-axis direction, the Y-axis direction, and the Z-axis direction in an automatic manner.

As illustrated in FIGS. 2 and 3, an opening (first opening) 41 is formed in the intermediate layer 4. The opening 41 is open on both sides of the intermediate layer 4 in the Z-axis direction. An opening (second opening) 21 is framed in the support layer 2. The opening 21 is open on both sides of the support layer 2 in the Z-axis direction. In the optical module 1, a continuous space S1 is constituted of a region inside the opening 41 of the intermediate layer 4 and a region inside the opening 21 of the support layer 2. That is, the space S1 includes a region inside the opening 41 of the intermediate layer 4 and a region inside the opening 21 of the support layer 2.

The space S1 is formed between the support layer 2 and the device layer 3 and corresponds to at least the mounting region 31 and the driving region 32. Specifically, a region inside the opening 41 of the intermediate layer 4 and a region inside the opening 21 of the support layer 2 include a range in which the mounting region 31 moves when viewed in the Z-axis direction. A region inside the opening 41 of the intermediate layer 4 forms a clearance for causing a part (that is, a part to be in a detached state with respect to the support layer 2, for example, the mounting region 31 in its entirety, the elastic deformation portion 34b of each of the elastic support regions 34, the first comb-teeth portions 33a, and the second comb-teeth portions 31a) of the mounting region 31 and the driving region 32, which needs to be separated from the support layer 2, to be separated from the support layer 2. That is, the space S1 corresponding to at least the mounting region 31 and the driving region 32 means a space formed between the support layer 2 and the device layer 3 such that the mounting region 31 in its entirety and at least a portion of the driving region 32 are separated from the support layer 2.

A portion of each of the interlock portions 55 included in the movable mirror 5 is positioned in the space S1. Specifically, a portion of each of the interlock portions 55 is positioned in a region inside the opening 21 of the support layer 2 through a region inside the opening 41 of the intermediate layer 4. A portion of each of the interlock portions 55 protrudes into the space S1 from a surface of the device layer 3 on the intermediate layer 4 side by approximately 100 µm, for example. As described above, since a region inside the opening 41 of the intermediate layer 4 and a region inside the opening 21 of the support layer 2 include the range in which the mounting region 31 moves when viewed in the Z-axis direction, a portion of each of the interlock portions 55 of the movable mirror 5 positioned in the space S1 does not come into contact with the intermediate layer 4 and the support layer 2 when the mounting region 31 reciprocates in the direction A.

Fixed Mirror and Surrounding Structure Thereof

Figure 4:
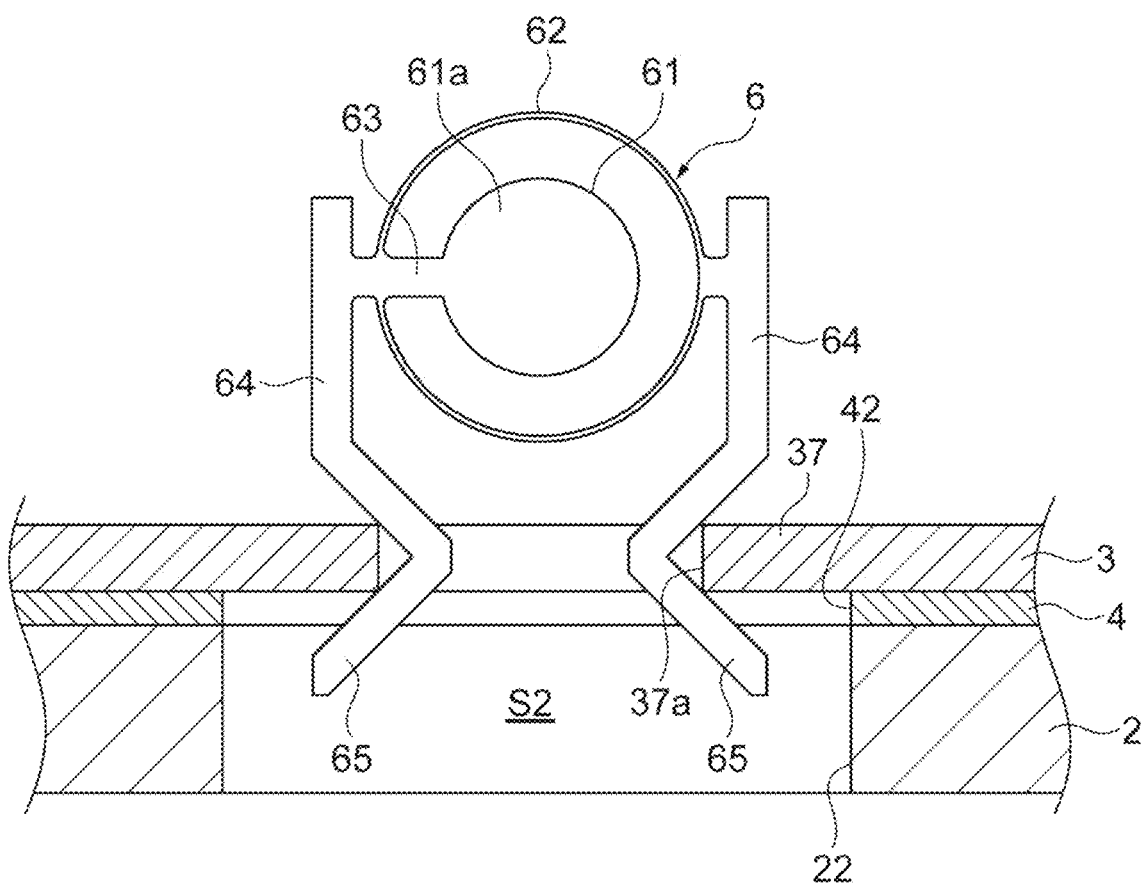
FIG. 4 is a cross-sectional view taken along line IV-IV illustrated in FIG. 1.
Figure 5:
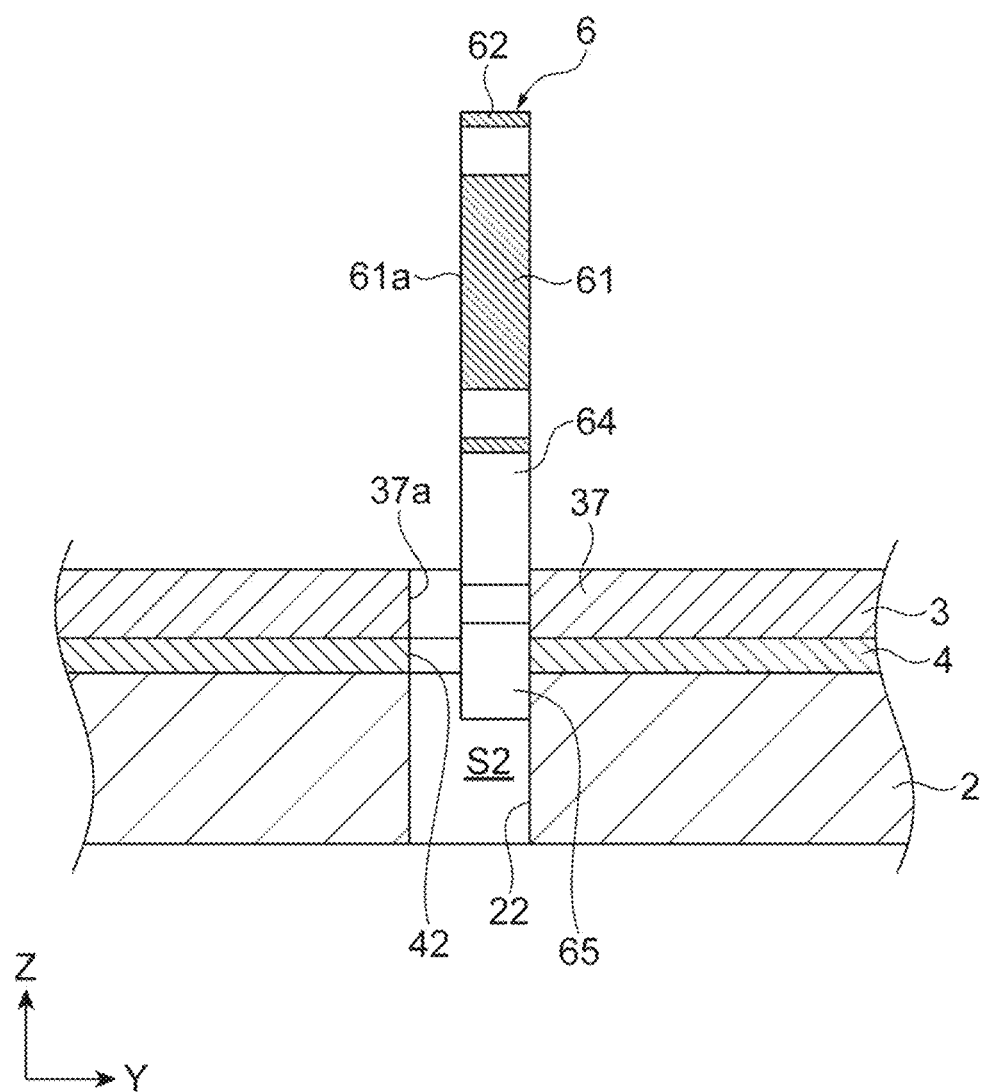
FIG. 5 is a cross-sectional view taken along line V-V illustrated in FIG. 1.

As illustrated in FIGS. 4 and 5, the fixed mirror 6 has the mirror portion 61, an elastic portion 62, a coupling portion 63, a pair of leg portions 64, and a pair of interlock portions 65. The fixed mirror 6 having a configuration described below is integrally formed by a MEMS technology (patterning and etching).

The mirror portion 61 is formed to have a plate shape (for example, a disk shape) having the mirror surface 61a as a main surface. The elastic portion 62 is formed to have an annular shape (for example, a circular shape) being separated from the mirror portion 61 and surrounding the mirror portion 61 when viewed in the Y-axis direction (direction perpendicular to the mirror surface 61a). The coupling portion 63 causes the mirror portion 61 and the elastic portion 62 to be coupled to each other on one side in the X-axis direction with respect to the center of the mirror portion 61 when viewed in the Y-axis direction.

The pair of leg portions 64 are coupled to an outer surface of the elastic portion 62 on both sides in the X-axis direction with respect to the center of the mirror portion 61 when viewed in the Y-axis direction. That is, the mirror portion 61 and the elastic portion 62 are disposed between the pair of leg portions 64 in the X-axis direction. Each of the leg portions 64 extends to the mounting region 37 side beyond the mirror portion 61 and the elastic portion 62. The pair of interlock portions 65 are respectively provided in end portions of the leg portions 64 on the mounting region 37 side. The interlock portions 65 are formed to be bent inward (toward each other) in a V-shape, for example, when viewed in the Y-axis direction.

The fixed mirror 6 having a configuration described above is mounted in the mounting region 37 when the pair of interlock portions 65 are disposed in an opening 37a formed in the mounting region 37. The opening 37a is open on both sides of the mounting region 37 in the Z-axis direction. A portion of each of the interlock portions 65 protrudes from a surface of the mounting region 37 on the intermediate layer 4 side. That is, the fixed mirror 6 penetrates the mounting region 37.

Forces act outward (away from each other) on the pair of interlock portions 65 disposed in the opening 37a of the mounting region 37. The fixed mirror 6 is fixed to the mounting region 37 due to the forces. The forces are generated due to the annular elastic portion 62 which is compressed when the fixed mirror 6 is mounted in the mounting region 37 and has a tendency of being restored to the initial state.

As illustrated in FIG. 1, the opening 37a is formed to have a trapezoidal shape widening toward the end on a side opposite to the beam splitter 7 when viewed in the Z-axis direction. When the pair of interlock portions 65 exhibiting inwardly bent shapes engage with the opening 37a exhibiting such a shape, the fixed mirror 6 is positionally aligned (self-aligned) in each of the X-axis direction, the Y-axis direction, and the Z-axis direction in an automatic manner.

As illustrated in FIGS. 4 and 5, an opening 42 is formed in the intermediate layer 4. The opening 42 includes the opening 37a of the mounting region 37 when viewed in the Z-axis direction and is open on both sides of the intermediate layer 4 in the Z-axis direction. An opening 22 is formed in the support layer 2. The opening 22 includes the opening 37a of the mounting region 37 when viewed in the Z-axis direction and is open on both sides of the support layer 2 in the Z-axis direction. In the optical module 1, a continuous space S2 is constituted of a region inside the opening 42 of the intermediate layer 4 and a region inside the opening 22 of the support layer 2. That is, the space S2 includes a region inside the opening 42 of the intermediate layer 4 and a region inside the opening 22 of the support layer 2.

A portion of each of the interlock portions 65 included in the fixed mirror 6 is positioned in the space S2. Specifically, a portion of each of the interlock portions 65 is positioned in a region inside the opening 22 of the support layer 2 through a region inside the opening 42 of the intermediate layer 4. A portion of each of the interlock portions 65 protrudes into the space S2 from a surface of the device layer 3 on the intermediate layer 4 side by approximately 100 µm, for example.

Actions and Effects

In the optical module 1, in the device layer 3, the mounting region 31 in which the movable mirror 5 is mounted is disposed between the pair of elastic support regions 34 and is supported by the pair of elastic support regions 34. Accordingly, for example, compared to a case where a region extending from the mounting region 31 is supported by an elastic support region 34, the mounting region 31 in which the movable mirror 5 is mounted can be stably moved. Thus, according to the optical module 1, reliable movement of the movable mirror 5 mounted in the device layer 3 is realized.

Figure 6:
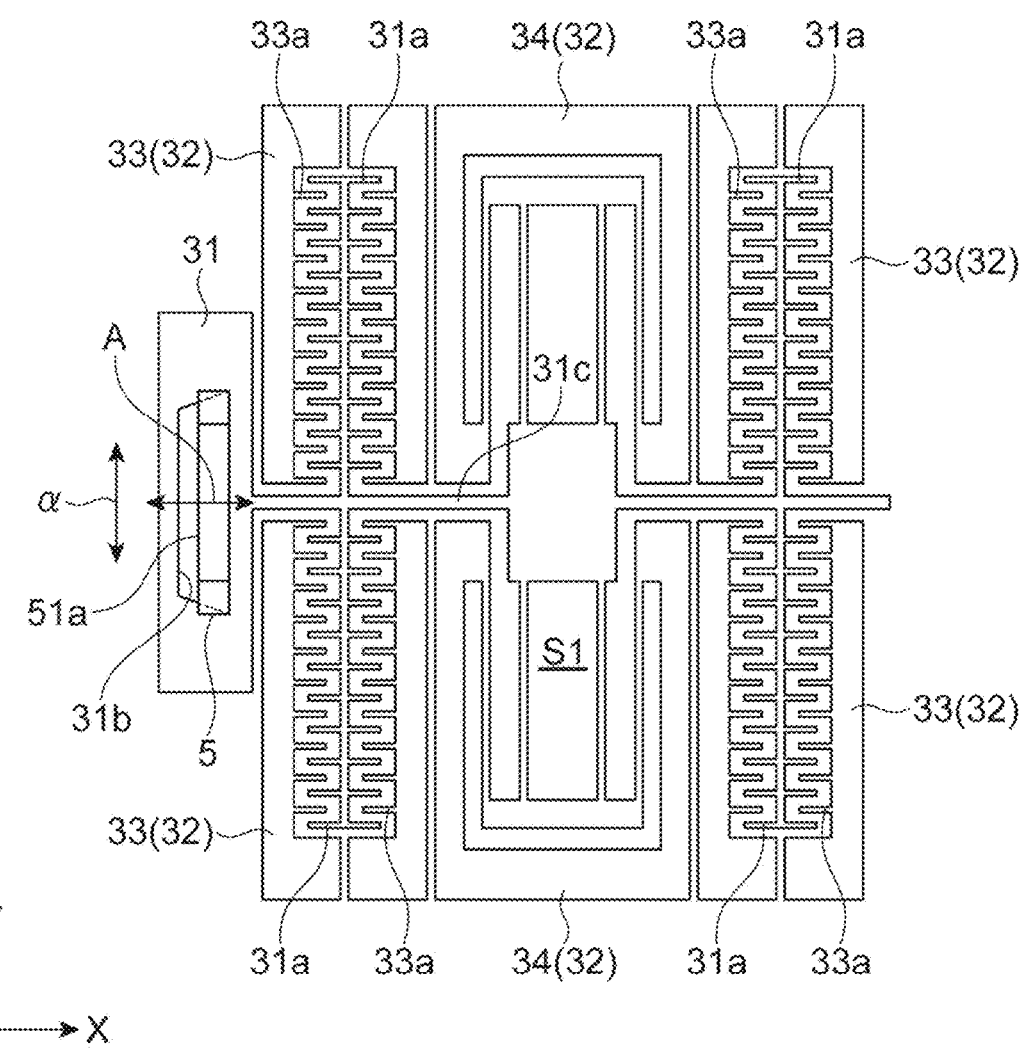
FIG. 6 is a view for describing vibration tolerance of a movable mirror and a mounting region of a comparative example.
Figure 6:
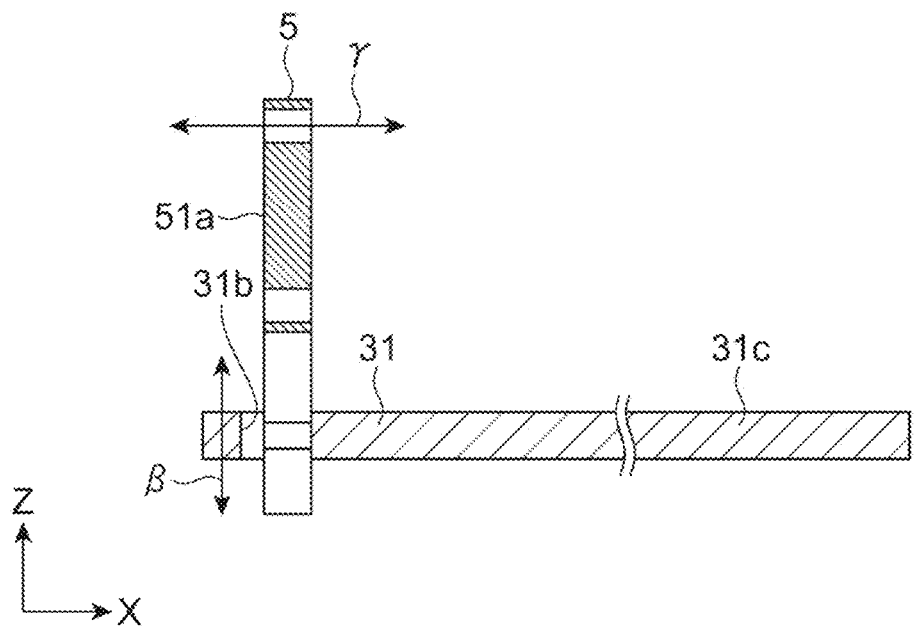

As illustrated in (a) and (b) of FIG. 6, in a configuration in which a region 31c extending from the mounting region 31 is supported by the elastic support regions 34, the vibration tolerance of the mounting region 31 in the Y-axis direction (arrow α indicated in (a) of FIG. 6), the vibration tolerance of the mounting region 31 in the Z-axis direction (arrow β indicated in (b) of FIG. 6), and the vibration tolerance of the movable mirror 5 in the X-axis direction (arrow γ indicated in (b) of FIG. 6) are likely to decrease. In contrast, in the configuration of the optical module 1, the vibration tolerance of the mounting region 31 in the Y-axis direction and the vibration tolerance of the mounting region 31 in the Z-axis direction can be improved. In FIG. 6, the first electrode 35 and the second electrode 36 are omitted from the diagram.

In addition, in the optical module 1, the support layer 2 is the first silicon layer of the SOI substrate, the device layer 3 is the second silicon layer of the SOI substrate, and the intermediate layer 4 is the insulating layer of the SOI substrate. Accordingly, it is possible to favorably realize a configuration for reliable movement of the movable mirror 5 mounted in the device layer 3 using the SOI substrate.

In addition, in the optical module 1, the pair of elastic support regions 34 sandwich the mounting region 31 from both sides when viewed in the direction A in which the mounting region 31 moves. Accordingly, it is possible to simplify the configuration for reliable movement of the movable mirror 5 mounted in the device layer 3.

In addition, in the optical module 1, the movable mirror 5, the fixed mirror 6, and the beam splitter 7 are disposed such that the interference optical system 10 is constituted. Accordingly, it is possible to obtain an FTIR having improved sensitivity.

In addition, in the optical module 1, the light incident unit 8 is disposed such that measurement light is incident on the interference optical system 10 from outside, and the light emission unit 9 is disposed such that measurement light is emitted from the interference optical system 10 to the outside. Accordingly, it is possible to obtain an FTIR including the light incident unit 8 and the light emission unit 9.

MODIFICATION EXAMPLES

Hereinabove, an embodiment of the present disclosure has been described. However, the present disclosure is not limited to the foregoing embodiment. For example, the material and the shape of each configuration are not limited to the materials and the shapes described above, and various materials and shapes can be employed. As an example thereof, the shapes of the mirror portion 51 and the mirror surface 51a are not limited to a circular shape, and other shapes such as a rectangular shape may be adopted.

In addition, as long as the space S1 is formed between the support layer 2 and the device layer 3 and corresponds to at least the mounting region 31 and the driving region 32, various forms can be employed. For example, in place of the opening 21, a recess portion open on the device layer 3 side may be formed in the support layer 2, and the space S1 may be constituted of a region inside the opening 41 of the intermediate layer 4 and a region inside the recess portion of the support layer 2.

In addition, the support layer 2 and the device layer 3 may be joined to each other without having the intermediate layer 4 interposed therebetween. In this case, the support layer 2 is formed of silicon, glass, or ceramic, for example, and the device layer 3 is formed of silicon, for example. The support layer 2 and the device layer 3 are joined to each other through direct joining, surface activation joining, plasma joining, anodic joining, metal joining, or resin joining, for example.

Even in a case where the support layer 2 and the device layer 3 are joined to each other without having the intermediate layer 4 interposed therebetween, as long as the space S1 is formed between the support layer 2 and the device layer 3 and corresponds to at least the mounting region 31 and the driving region 32, various forms can be employed. For example, the space S1 may be constituted of an opening formed in the support layer 2 open on both sides of the support layer 2. The space S1 may be constituted of a recess portion formed in the support layer 2 open on the device layer 3 side. The space S1 may be constituted of an opening formed in the support layer 2 open on both sides of the support layer 2, and a recess portion formed in the device layer 3 open on the support layer 2 side. The space S1 may be constituted of a recess portion formed in the support layer 2 open on the device layer 3 side, and a recess portion formed in the device layer 3 open on the support layer 2 side. The space S1 may be constituted of a recess portion formed in the device layer 3 open on the support layer 2 side.

Figure 7:
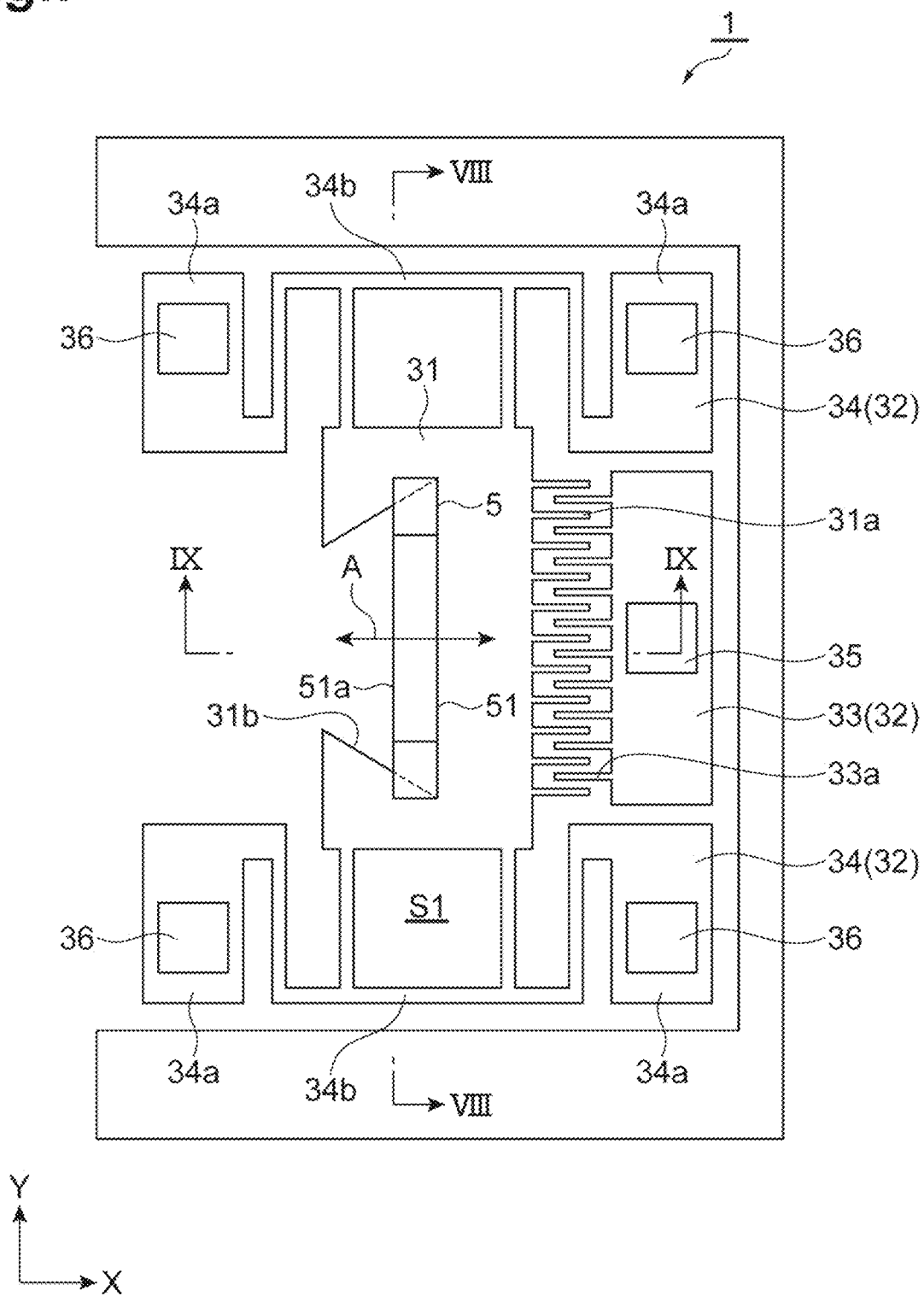
FIG. 7 is a plan view of an optical module of another embodiment.
Figure 8:
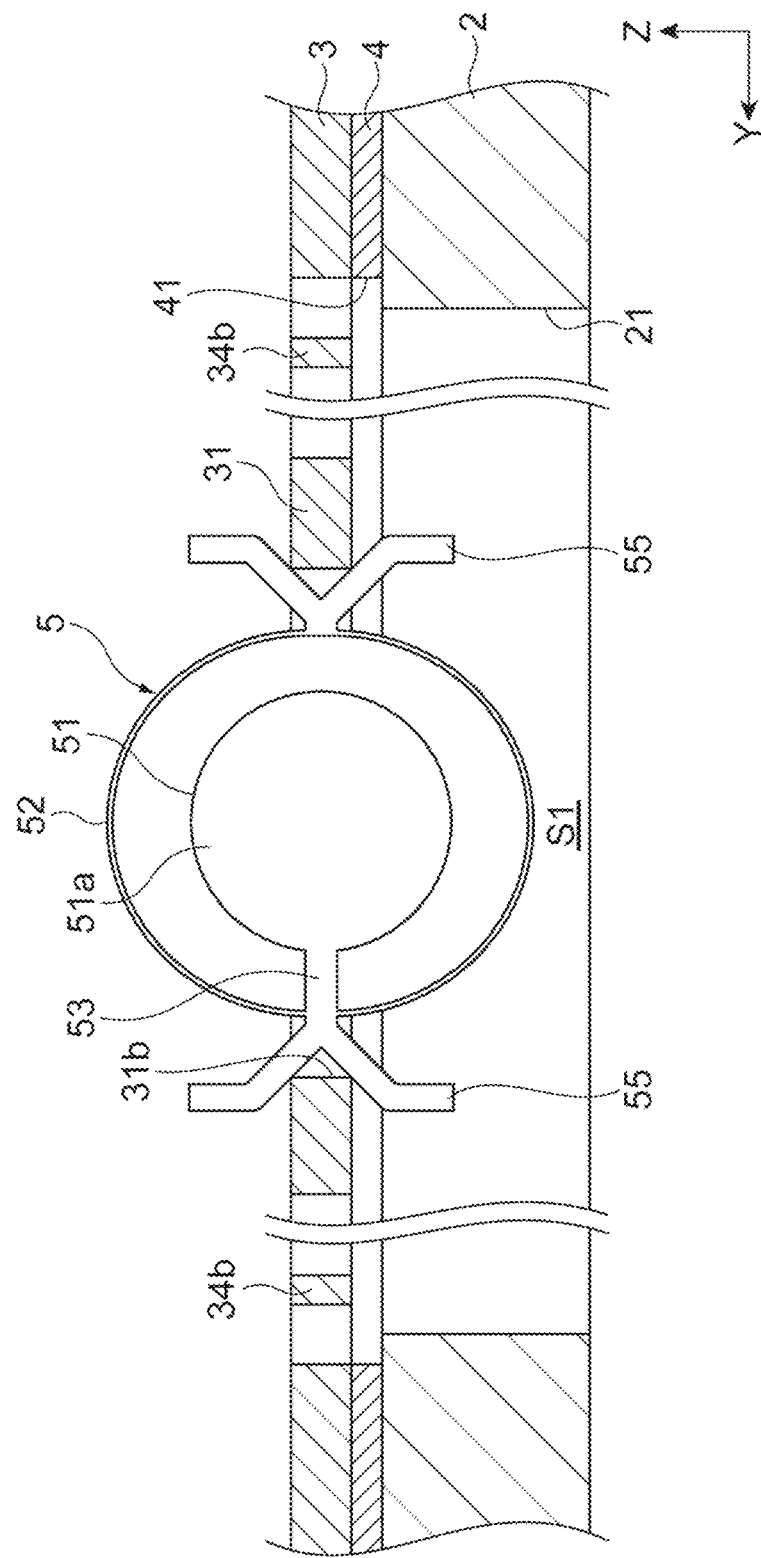
FIG. 8 is a cross-sectional view taken along line VIII-VIII illustrated in FIG. 7.
Figure 9:
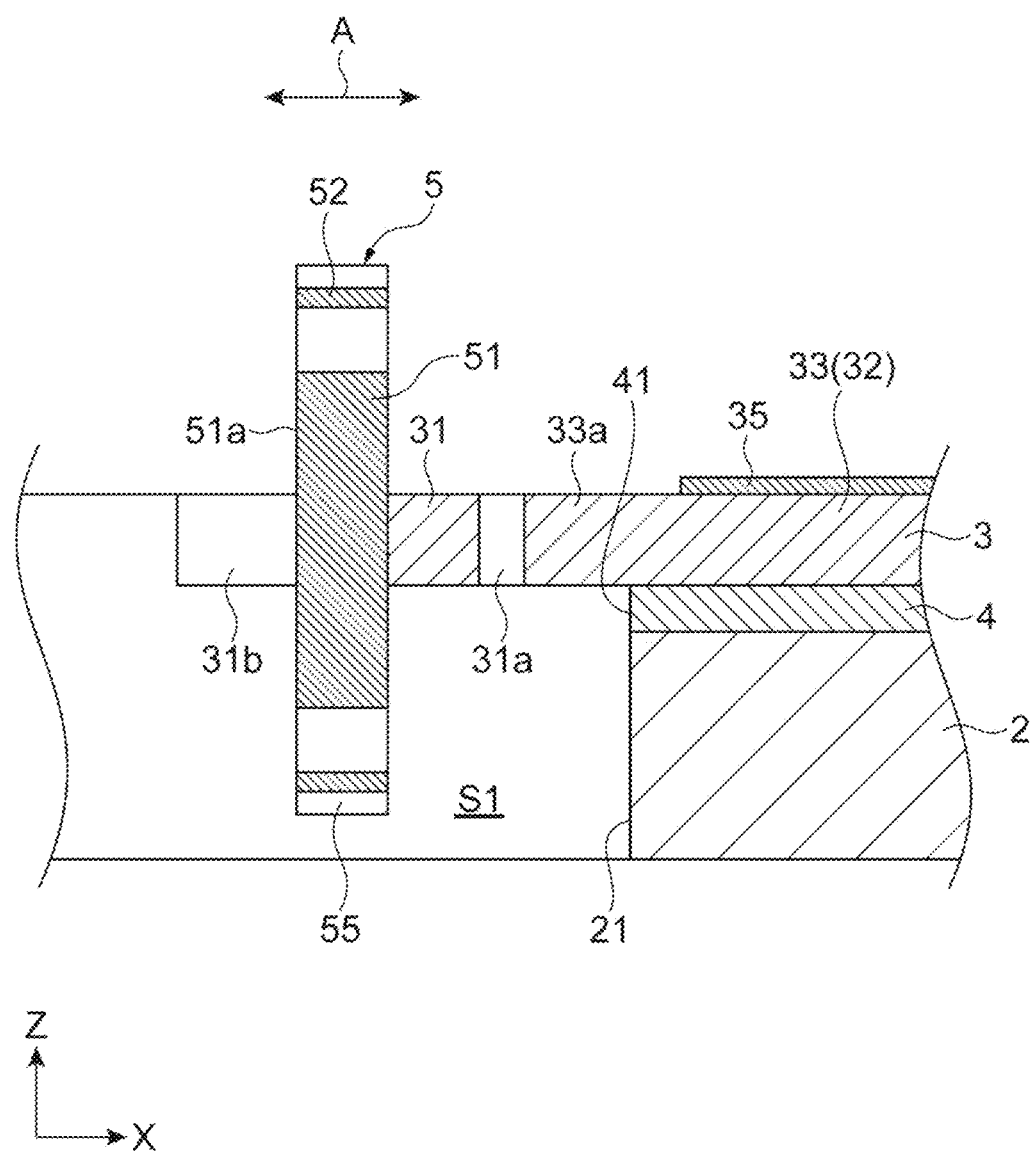
FIG. 9 is a cross-sectional view taken along line IX-IX illustrated in FIG. 7.

In addition, as illustrated in FIGS. 7, 8, and 9, the movable mirror 5 may penetrate the mounting region 31 in a state where the mirror surface 51a intersects the mounting region 31. In the optical module 1 illustrated in FIGS. 7, 8, and 9, the pair of leg portions 54 are not provided in the movable mirror 5. The pair of interlock portions 55 are coupled to outer surfaces of the elastic portion 52 on both sides in the Y-axis direction with respect to the center of the mirror portion 51 when viewed in the X-axis direction. That is, the mirror portion 51 and the elastic portion 52 are disposed between the pair of interlock portions 55 in the Y-axis direction. A part facing the mirror surface 51a, of a part defining the opening 31b in the mounting region 31, is cut out to allow the measurement light L0 to pass therethrough.

In the optical module 1 illustrated in FIGS. 7, 8, and 9, the mirror surface 51a of the movable mirror 5 intersects the mounting region 31. Accordingly, a centroid position of the movable mirror 5 can be brought closer to the mounting region 31. Therefore, it is possible to more stably move the mounting region 31 in which the movable mirror 5 is mounted.

As described above, in a configuration in which the region 31c extending from the mounting region 31 is supported by the elastic support regions 34, the vibration tolerance of the mounting region 31 in the Y-axis direction (arrow α indicated in (a) of FIG. 6), the vibration tolerance of the mounting region 31 in the Z-axis direction (arrow (3 indicated in (b) of FIG. 6), and the vibration tolerance of the movable mirror 5 in the X-axis direction (arrow α indicated in (b) of FIG. 6) are likely to decrease. In contrast, in the configuration of the optical module 1 illustrated in FIGS. 7, 8, and 9, the vibration tolerance of the mounting region 31 in the Y-axis direction, the vibration tolerance of the mounting region 31 in the Z-axis direction, and the vibration tolerance of the movable mirror 5 in the X-axis direction can be improved.

In addition, various forms can be employed for the driving region 32 as long as the pair of elastic support regions 34 support the mounting region 31 in a state of sandwiching the mounting region 31 therebetween. For example, in each of the elastic support regions 34, a pair of spring parts 34c of the elastic deformation portion 34b connected to the mounting region 31 may be connected to each other as illustrated in (a) of FIG. 10, or may be isolated from each other as illustrated in (b) of FIG. 10. In addition, in each of the elastic support regions 34, a pair of spring parts 34d of the elastic deformation portion 34b respectively connected to both the end portions 34a may extend to a side opposite to the mounting region 31 as illustrated in (a) of FIG. 11. In addition, in each of the elastic support regions 34, the elastic deformation portion 34b may have three or more spring parts 34c as illustrated in (b) of FIG. 11. In addition, in each of the elastic support regions 34, the pair of spring parts 34c of the elastic deformation portion 34b may be respectively connected to both side surfaces of the mounting region 31 in the X-axis direction as illustrated in FIG. 12. In addition, the pair of elastic support regions 34 may be disposed on both sides of the mounting region 31 in the X-axis direction as illustrated in (a) and (b) of FIG. 13. In FIGS. 10 to 13, the first electrode 35 and the second electrode 36 are omitted from the diagram.

Figure 10:
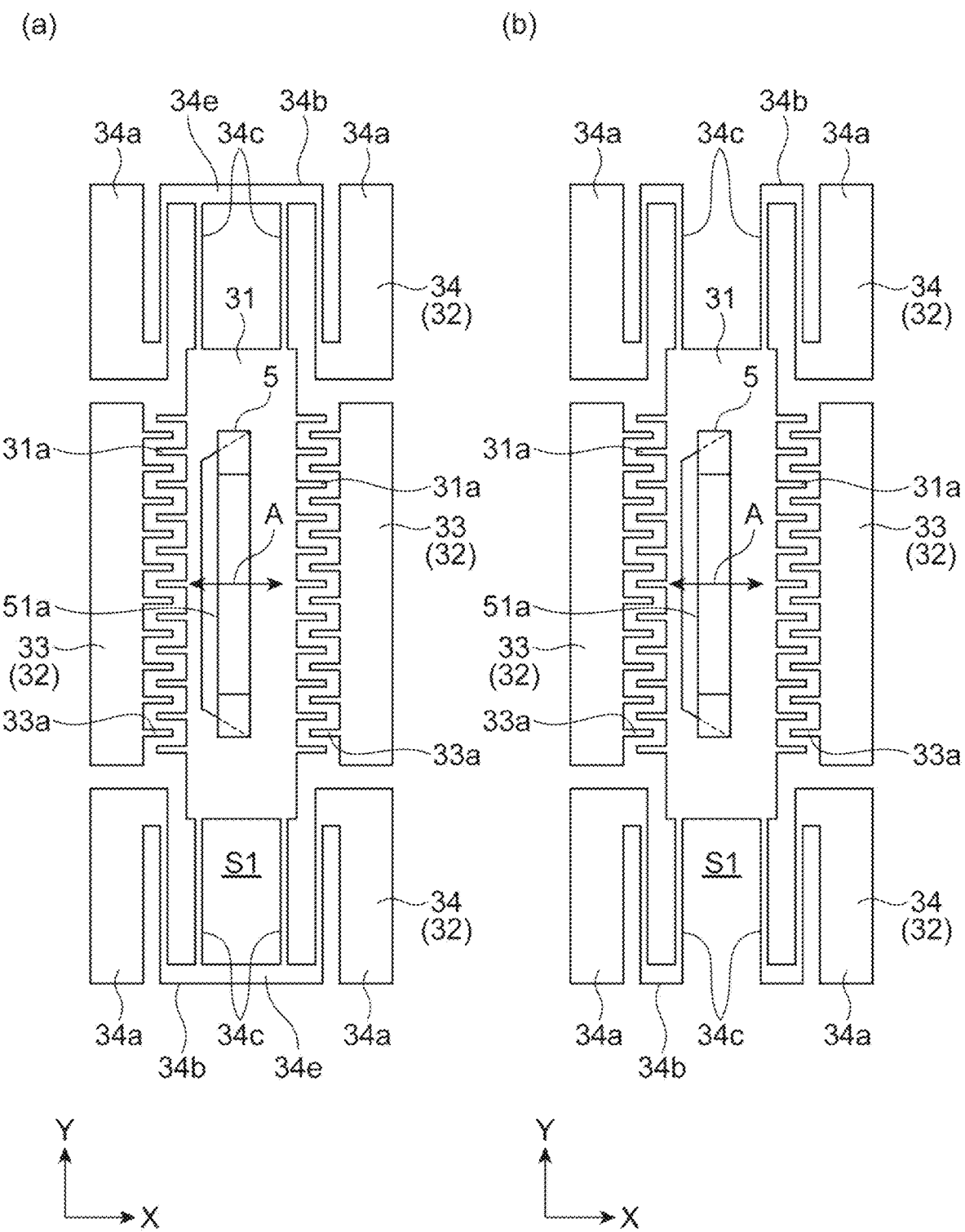
FIG. 10 is a plan view of a modification example of the movable mirror and a surrounding structure thereof.
Figure 11:
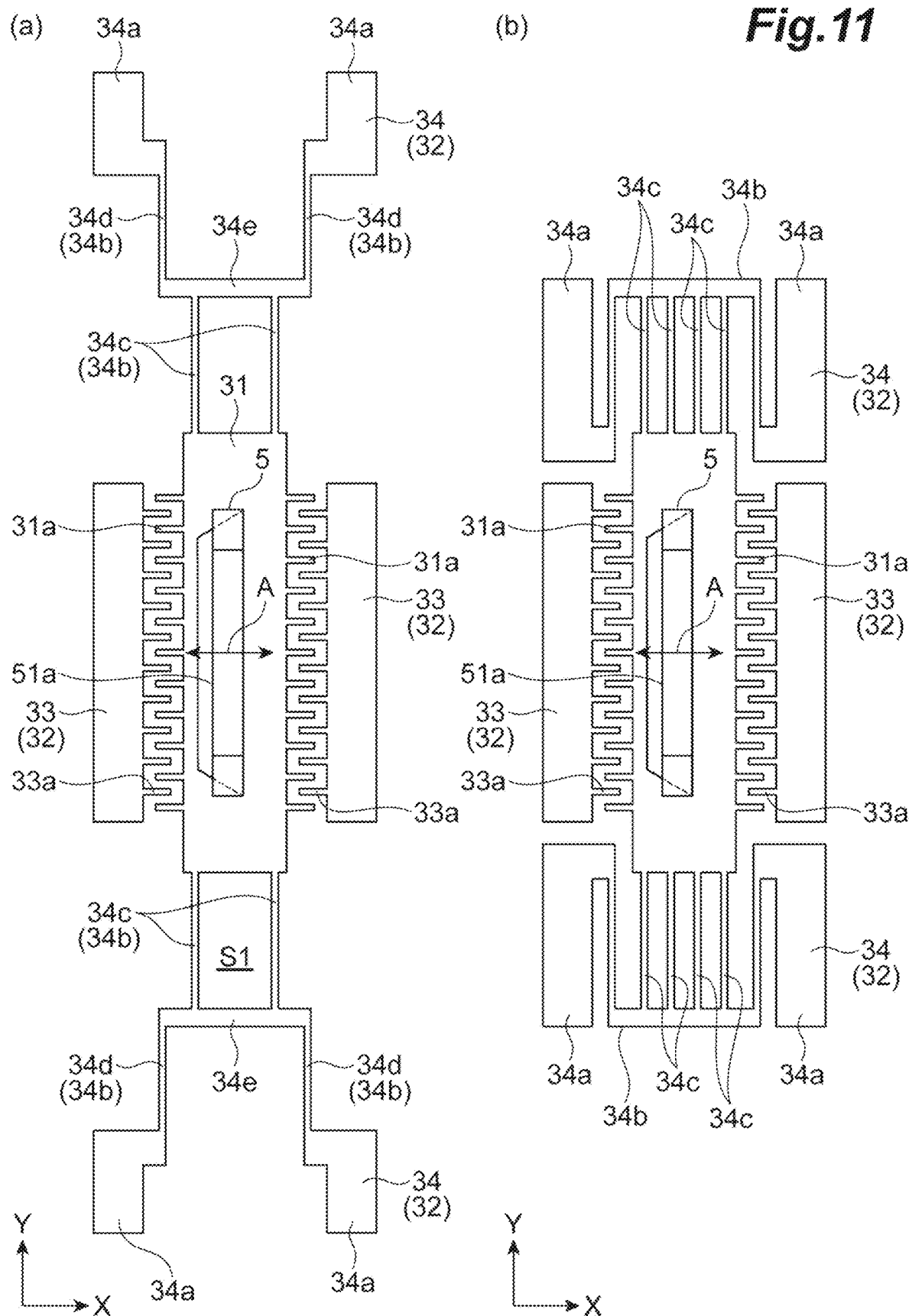
FIG. 11 is a plan view of another modification example of the movable mirror and the surrounding structure thereof.
Figure 12:
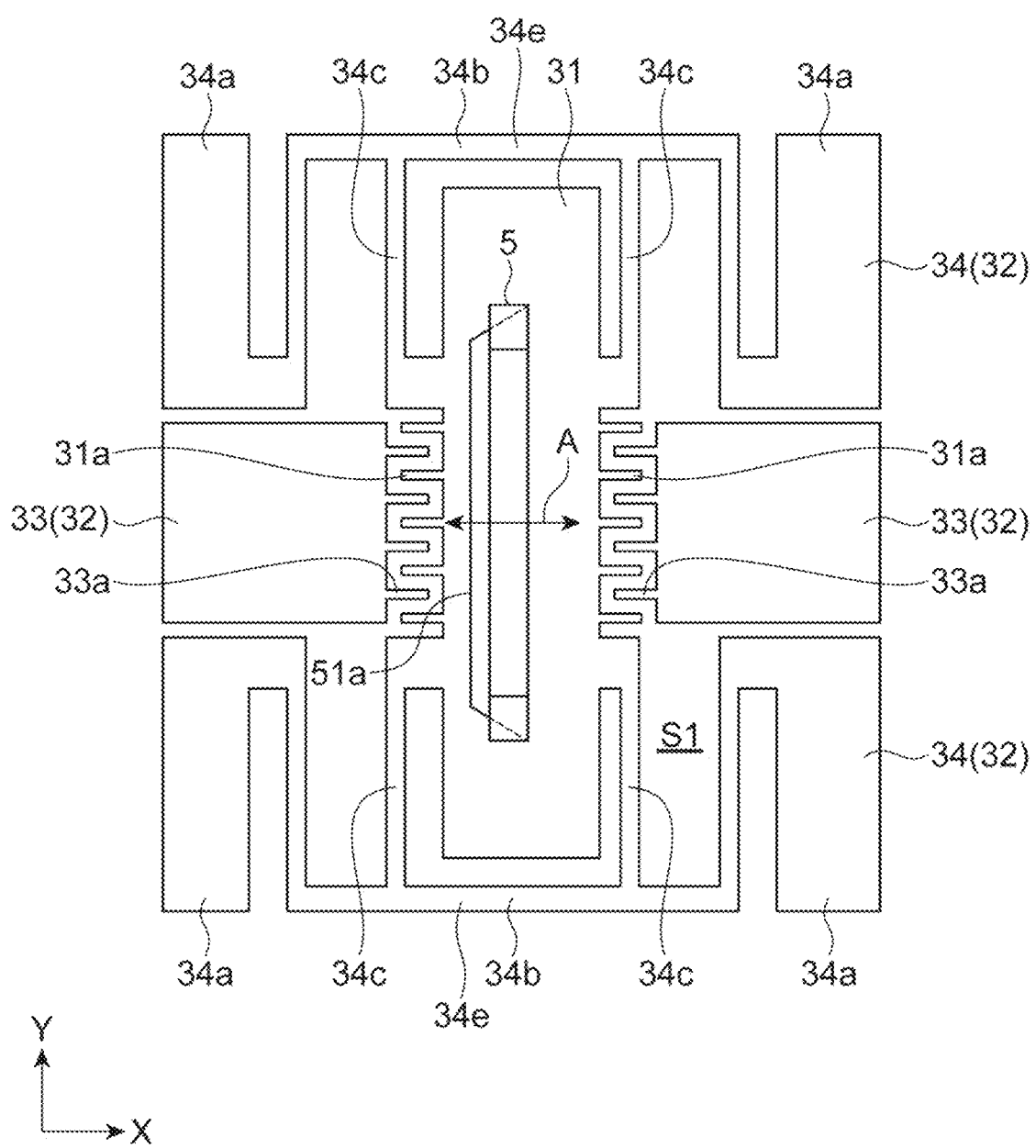
FIG. 12 is a plan view of another modification example of the movable mirror and the surrounding structure thereof.
Figure 13:
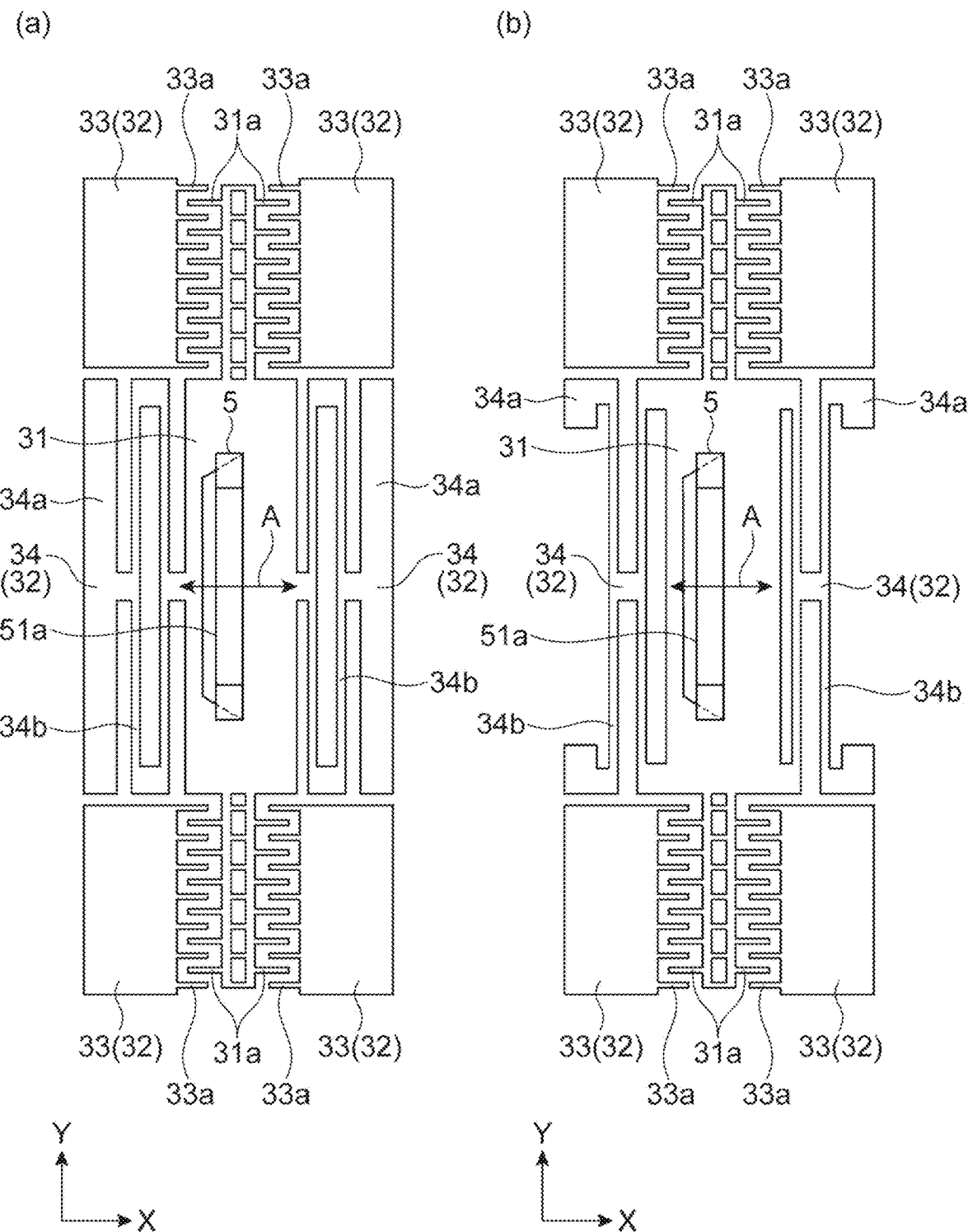
FIG. 13 is a plan view of another modification example of the movable mirror and the surrounding structure thereof.

As illustrated in (a) of FIGS. 10 and 11, and FIG. 12, in a case where the elastic deformation portion 34b of each of the elastic support regions 34 includes a plurality of spring parts 34c, when one end portion of each of the spring parts 34c is connected to the mounting region 31, it is preferable that the other end portions of the spring parts 34c be connected to each other via a beam-like part 34e. According to this configuration, compared to a case where the other end portions of the spring parts 34c are not connected to each other, unnecessary vibration of the movable mirror 5 can be more reliably curbed. Particularly, this configuration is effective when the elastic deformation portion 34b of each of the elastic support regions 34 includes the pair of spring parts 34c.

In addition, as illustrated in (a) of FIGS. 10 and 11, and FIG. 12, it is preferable that a distance (gap) between the spring parts 34c adjacent to each other in the elastic deformation portion 34b of each of the elastic support regions 34 be larger than the thickness of the movable mirror 5, and the centroid position of the movable mirror 5 in the direction A in which the mounting region 31 moves when the mounting region 31 is positioned at an initial position be positioned between a position of one end portion (end portion connected to the mounting region 31) (which will hereinafter be referred to as "a connection end portion") of one spring part 34c (one of the spring parts 34c adjacent to each other) in the direction A and a position of the connection end portion of the other spring part 34c (the other of the spring parts 34c adjacent to each other) in the direction A. These positions are positions in the direction A (X-coordinates in (a) of FIGS. 10 and 11, and FIG. 12). According to this configuration, the moving amount of the mounting region 31 can be ensured without increasing the number of spring parts 34c in the elastic deformation portion 34b of each of the elastic support regions 34, and unnecessary vibration of the movable mirror 5 can be curbed. Particularly, this configuration is effective when the elastic deformation portion 34b of each of the elastic support regions 34 includes the pair of spring parts 34c.

In addition, as illustrated in (a) of FIGS. 10 and 11, when the elastic deformation portion 34b of each of the elastic support regions 34 includes the pair of spring parts 34c, it is preferable that the distance (gap) between the spring parts 34c adjacent to each other in the elastic deformation portion 34b of each of the elastic support regions 34 be larger than a first distance from one end portion of the mounting region 31 in the direction A to the connection end portion of one spring part 34c, and a second distance from the other end portion of the mounting region 31 in the direction A to the connection end portion of the other spring part 34c. Then, it is more preferable that the first distance and the second distance be equal to each other. According to this configuration, the moving amount of the mounting region 31 can be ensured without increasing the number of spring parts 34c in the elastic deformation portion 34b of each of the elastic support regions 34, and unnecessary vibration of the movable mirror 5 can be curbed.

In addition, in the foregoing embodiment, the fixed mirror 6 is mounted in the device layer 3. However, the fixed mirror 6 need only be mounted in at least one of the support layer 2, the device layer 3, and the intermediate layer 4. In addition, in the foregoing embodiment, the beam splitter 7 is mounted in the support layer 2. However, the beam splitter 7 need only be mounted in at least one of the support layer 2, the device layer 3, and the intermediate layer 4. In addition, the beam splitter 7 is not limited to a cube-type beam splitter and may be a plate-type beam splitter.

In addition, the optical module 1 may include a light emitting element for generating measurement light to be incident on the light incident unit 8, in addition to the light incident unit 8. Alternatively, the optical module 1 may include a light emitting element for generating measurement light to be incident on the interference optical system 10, in place of the light incident unit 8. In addition, the optical module 1 may include a light receiving element for detecting measurement light (interference light) emitted from the light emission unit 9, in addition to the light emission unit 9. Alternatively, the optical module 1 may include a light receiving element for detecting measurement light (interference light) emitted from the interference optical system 10, in place of the light emission unit 9.

In addition, a first penetration electrode which is electrically connected to each of the actuator regions 33 and a second penetration electrode which is electrically connected to each of both the end portions 34a of each of the elastic support regions 34 may be provided in the support layer 2 and the intermediate layer 4 (in only the support layer 2 when the intermediate layer 4 is not present), and a voltage may be applied to a part between the first penetration electrode and the second penetration electrode. In addition, the actuator for moving the mounting region 31 is not limited to an electrostatic actuator, and a piezoelectric actuator or an electromagnetic actuator may be adopted, for example. In addition, the optical module 1 is not limited to a module for constituting an FTIR and may be a module for constituting other optical systems.

REFERENCE SIGNS LIST

1 . . . optical module, 2 . . . support layer, 3 . . . device layer, 4 . . . intermediate layer, 5 . . . movable mirror, 6 . . . fixed mirror, 7 . . . beam splitter, 8 . . . light incident unit, 9 . . . light emission unit, 10 . . . interference optical system, 31 . . . mounting region, 32 . . . driving region, 34 . . . elastic support region, 41 . . . opening, 51a . . . mirror surface, S1 . . . space

The invention claimed is:

1. An optical module comprising:
a support layer;
a device layer which is provided on the support layer; and
a movable mirror which is mounted in the device layer,
wherein the device layer has:
   a mounting region in which the movable mirror is mounted, and
   a driving region which is connected to the mounting region,
wherein a space corresponding to at least the mounting region and the driving region is formed in at least one of the support layer and the device layer, wherein the mounting region is disposed between a pair of elastic support regions included in the driving region and is supported by the pair of elastic support regions, and a mirror surface of the movable mirror is in a positional relationship of intersecting with a surface of the mounting region on a side opposite to the space.

2. The optical module according to claim 1, further comprising:

an intermediate layer which is provided between the support layer and the device layer, wherein an opening is formed in the intermediate layer, wherein the space includes a region inside the opening, wherein the support layer is a first silicon layer of an SOI substrate, wherein the device layer is a second silicon layer of the SOI substrate, and wherein the intermediate layer is an insulating layer of the SOI substrate.

3. The optical module according to claim 1, wherein the pair of elastic support regions sandwich the mounting region from both sides when viewed in a direction in which the mounting region moves.

4. The optical module according to claim 1, wherein a mirror surface of the movable mirror intersects the mounting region.

5. The optical module according to claim 1, further comprising:

a fixed mirror which is mounted in at least one of the support layer, the device layer, and an intermediate layer which is provided between the support layer and the device layer; and a beam splitter which is mounted in at least one of the support layer, the device layer, and the intermediate layer, wherein the movable mirror, the fixed mirror, and the beam splitter are disposed such that an interference optical system is constituted.

6. The optical module according to claim 5, further comprising:

a light incident unit which is disposed such that measurement light is incident on the interference optical system from outside; and a light emission unit which is disposed such that the measurement light is emitted from the interference optical system to the outside.

* * * * *